(12) United States Patent  
Jayaraman et al.

(10) Patent No.: US 6,798,288 B1
(45) Date of Patent: Sep. 28, 2004

(54) RECEIVE BAND REJECTION FOR A DIGITAL RF AMPLIFIER

(75) Inventors: Arun Jayaraman, Mountain View, CA (US); Cary L. Delano, Los Altos, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 88 days.

(21) Appl. No.: 09/963,874

(22) Filed: Sep. 25, 2001

(Under 37 CFR 1.47)

Related U.S. Application Data

(60) Provisional application No. 60/235,478, filed on Sep. 26, 2000, provisional application No. 60/235,527, filed on Sep. 26, 2000, and provisional application No. 60/235,528, filed on Sep. 26, 2000.

(51) Int. Cl.[7] .............................................. H03F 21/00
(52) U.S. Cl. ................................... 330/207 A; 330/109
(58) Field of Search ................................ 330/107, 109, 330/149, 207 A, 302, 306

(56) References Cited

U.S. PATENT DOCUMENTS

| | | | | |
|---|---|---|---|---|
| 4,123,754 A | * | 10/1978 | Armstrong | ................. 343/615 |
| 5,777,512 A | * | 7/1998 | Tripathi et al. | ......... 330/207 A |
| 6,316,992 B1 | * | 11/2001 | Miao et al. | .................... 330/2 |

* cited by examiner

Primary Examiner—Henry Choe
(74) Attorney, Agent, or Firm—Beyer Weaver & Thomas, LLP

(57) ABSTRACT

A bandpass amplifier for use in a communication system is described. The amplifier includes a frequency selective network having a feedback path. The frequency selective network has first filtering circuitry for selectively passing the transmit band, and second filtering circuitry for selectively passing the receive band. The first filtering circuitry and the second filtering circuitry pass frequencies in the transmit band and reject frequencies in the receive band. A sampling analog-to-digital converter is coupled to the frequency selective network. A switching device is coupled to the sampling analog-to-digital converter for producing a continuous-time output signal. A feedback path is provided for continuously sensing and feeding back the continuous-time output signal to the frequency selective network.

28 Claims, 11 Drawing Sheets

RECEIVE BAND REJECTION FOR A DIGITAL RF AMPLIFIER

RELATED APPLICATION DATA

The present application claims priority from U.S. Provisional Patent Application No. 60/235,478 for METHOD FOR OPTIMAL OPERATION OF LOOP STRUCTURE OF CLASS-T AMPLIFIER FOR FDD SYSTEMS filed on Sep. 26, 2000, U.S. Provisional Patent Application No. 60/235,527 for METHOD FOR MAXIMIZING DYNAMIC RANGE OF CLASS-T POWER AMPLIFIER TO MEET RECEIVE BAND NOISE REQUIREMENTS IN FDD SYSTEMS filed on Sep. 26, 2000, and U.S. Provisional Patent Application No. 60/235,528 for METHOD OF RESONANCE CALIBRATION OF CLASS-T POWER AMPLIFIERS filed on Sep. 26, 2000, the entire disclosures of which are incorporated herein by reference for all purposes.

BACKGROUND OF THE INVENTION

The present invention relates to radio frequency (RF) communication systems, and more specifically, to apparatus and methods for rejecting receive band signals in RF mixed-signal amplifiers.

Wireless communication, such as cell phones for voice and data, has become extremely popular. Currently, several wireless schemes are in use, including GSM, TDMA, and CDMA. Of these, CDMA appears to be emerging as the standard in the U.S., European and Asian markets. CDMA often requires RF transmissions using both phase and amplitude modulation. The efficiency and power consumption of the power linear amplifiers used to generate an RF signal in either a CDMA cell phone or base station are therefore extremely important. Use of low efficiency linear amplifiers is detrimental for several reasons.

Such amplifiers tend to burn a significant amount of energy which is problematic, particularly in a battery operated cell phone. Power consumption is also problematic in base stations. The heat caused by many low efficiency amplifiers in a base station can cause components to fail, thus reducing reliability. The linearity of the power amplifier is also important. In a base stations where the transmission of multiple signals occurs simultaneously, amplifiers characterized by poor linearity may cause the inadvertent mixing of these signals.

A number of types of amplifier classes can be used in RF communication systems, including Class A, Class AB, Class C, Class E, Class F, and Class D (sometimes referred to as digital amplifiers). Each of these types of amplifiers, however, have significant problems when operating in the RF range. For example, Class A and Class AB amplifiers have very poor efficiency but reasonable linearity. Class C amplifiers are reasonably efficient but are only practical for phase modulation. Similarly Class E, F, and D amplifiers are typically only useful for phase modulation applications. Class E amplifiers have improved power efficiency when compared to C type amplifiers, but large voltage swings at their output limit their usefulness. Class F amplifiers exhibit relatively efficient switching characteristics with a repeating input signal. But with a non-repeating input signal, such as those normally encountered in a cellular phone or base station, the problems caused by harmonics become overwhelming.

Conventional class D amplifiers have linear operating characteristics and are generally highly efficient at lower frequencies but have heretofore been subject to several drawbacks at higher frequencies. Most notably, at higher frequencies such as RF they exhibit switching problems at their output transistors. As these transistors switch on and off rapidly, switching transients including high levels of current and voltage are developed at the output, causing overshoot and undershoot.

Another problem with conventional class D amplifiers when used in communication systems where RF signals are both transmitted and received is the "leakage" of energy from the transmit band into the receive band. This may occur if the duplexor or T/R switch at the antenna does not completely isolate the signals received at the communication device from the transmit circuitry within the device.

Most cellular systems today use frequency division duplexing (FDD) to achieve simultaneous transmit and receive capability. This is accomplished by using separate frequency bands for transmitting and receiving. For example, IS-95 CDMA systems in the United States uses 824–849 MHz for transmitting from a mobile station (i.e., upstream transmission) and 869–894 MHz for receiving at the mobile station (i.e., downstream transmission). FDD systems require limits on transmit emissions in the receive band to avoid corresponding degradation of the sensitivity of their own and neighboring mobile receivers. Systems which employ time division duplexing (TDD) also require limits on transmit emissions in the receive band, but typically to a lesser extent.

In view of the foregoing, an efficient amplifier capable of reducing transmit emissions in the receive band is needed. An amplifier capable of maximizing dynamic range in the transmit band to achieve maximum efficiency is also needed. A method for calibrating the transmit/receive band resonators so that the noise shaping capability is aligned to the transmit/receive bands is needed.

SUMMARY OF THE INVENTION

According to various embodiments of the present invention, a bandpass amplifier for use in a communication system is configured to reduce transmit emissions in the receive band and/or maximize dynamic range. The communication system has a transmit band and a receive band associated therewith. The bandpass amplifier includes a frequency selective network for noise shaping an input signal; an analog-to-digital converter coupled to the frequency selective network; a switching device coupled to the analog-to-digital converter for producing an output signal; and a feedback path for feeding back the output signal to the frequency selective network to facilitate the noise shaping. The frequency selective network includes first filtering circuitry for selectively passing the transmit band, and second filtering circuitry for selectively passing the receive band. The first and second filtering circuitry being configured to effect suppression of energy associated with the transmit band in the receive band.

One aspect of the present invention provides a bandpass amplifier having first and second signal paths. The first signal path includes a first number of transmit band resonators operable to resonate at the transmit band, and a second number of receive band resonators operable to resonate at the receive band. The second signal path including a third number of transmit band resonators operable to resonate at the transmit band, and a fourth number of receive band resonators operable to resonate at the receive band. The difference between the first and third numbers is equal to or less than two; and the difference between the second and fourth numbers is equal to or less than two.

According to a specific embodiment of the present invention, the bandpass amplifier further includes a signal generator for applying a test signal to a selected one of the resonators; a peak detector for detecting a signal strength of the signal passed through the selected one; and control circuitry for adjusting the selected resonator to maximize signal pass rate of the selected resonator at the corresponding one of the transmit and receive bands.

Another aspect of the present invention provides a method of calibrating a bandpass amplifier having a transmit band and a receive band associated therewith. The method includes receiving information representing the transmit band; calculating the receive band based on the information and a frequency offset between the transmit band and the receive band; and adjusting the first filtering circuitry and the second filtering circuitry to maximize signal pass rate at the transmit band and the receive band, respectively.

According to a specific embodiment of the present invention, the adjusting process includes selecting a filter which is to be calibrated among the first and second filtering circuitry; applying a signal to the selected filter; detecting signal strength of the signal which passes through the selected filter; and tuning the selected filter in response to the signal strength.

A further understanding of the nature and advantages of the present invention may be realized by reference to the remaining portions of the specification and the drawings.

DETAILED DESCRIPTION OF SPECIFIC EMBODIMENTS

Various embodiments of the present invention will now be described in detail with reference to the drawings, wherein like elements are referred to with like reference labels throughout.

Figure 1:
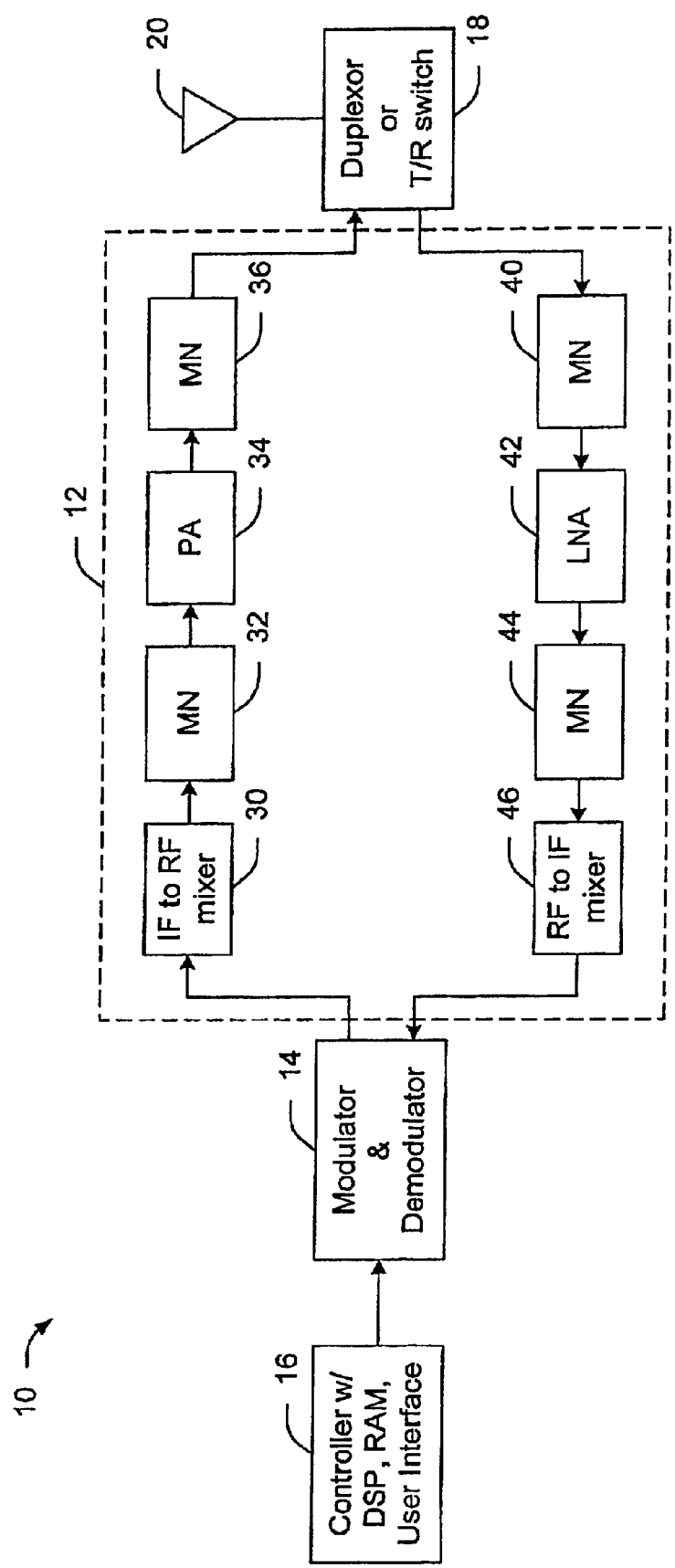
FIG. 1 is a block diagram of a cell phone according to a specific embodiment of the present invention.

Referring to FIG. 1, a simplified block diagram of a cell phone 10 designed according to the present invention is shown Cell phone 10 includes an RF block 12, a modulation and demodulation block 14, a controller block 16 including DSP, RAM, user interface, baseband circuitry configured to generate a baseband signal, and other standard circuitry used in a cell phone, a duplexor or a T/R (transmit/receive) switch 18 (a duplexor is used for cell phones that transmit and receive at the same time, and a T/R switch is used for cell phones that either transmit or receive alternately), and an LS antenna 20. For the sake of simplicity, the block 18 is collectively referred to as the "duplexor" in the specification. During transmission, the baseband circuitry in controller 16 is responsible for generating a baseband signal, which is typically a string of bits representative of the information to be transmitted. The baseband signal is then modulated in box 14 with an intermediate frequency (IF) modulation signal which is then provided to RF block 12. Since the functionality of the modulation and demodulation block 14, the controller 16, the duplexor 18 and the antenna 20 are all well known in the art, a detailed description of each is not provided herein.

The RF block 12 includes an IF to RF mixer 30 for generating an RF signal (e.g., 825 MHz) from the modulated signal received from the controller 16 through the modulator 14, a matching network (MN) 32, a power amplifier (PA) 34 configured to amplify the RF signal, and another matching network (MN) 36. During transmission, the amplifier 34 amplifies the RF signal and provides it to the antenna 20 via the matching network 36 and the duplexor 18. On the receive side, RF block 12 includes a matching network 40 configured to receive an RF signal (e.g., 870 MHz) received by antenna 20, a low noise amplifier (LNA) 42, another matching network 44, an RF to IF mixer 46 which mixes down the RF signal to the IF range and then provides it to the demodulator in block 14. Demodulator 14 demodulates the transmitted baseband information and provides it to controller 16. Since mixer circuits 30 and 46, LNA 42, and matching networks 32, 40 and 44 are all well known, they are not described in detail herein.

Figure 2:
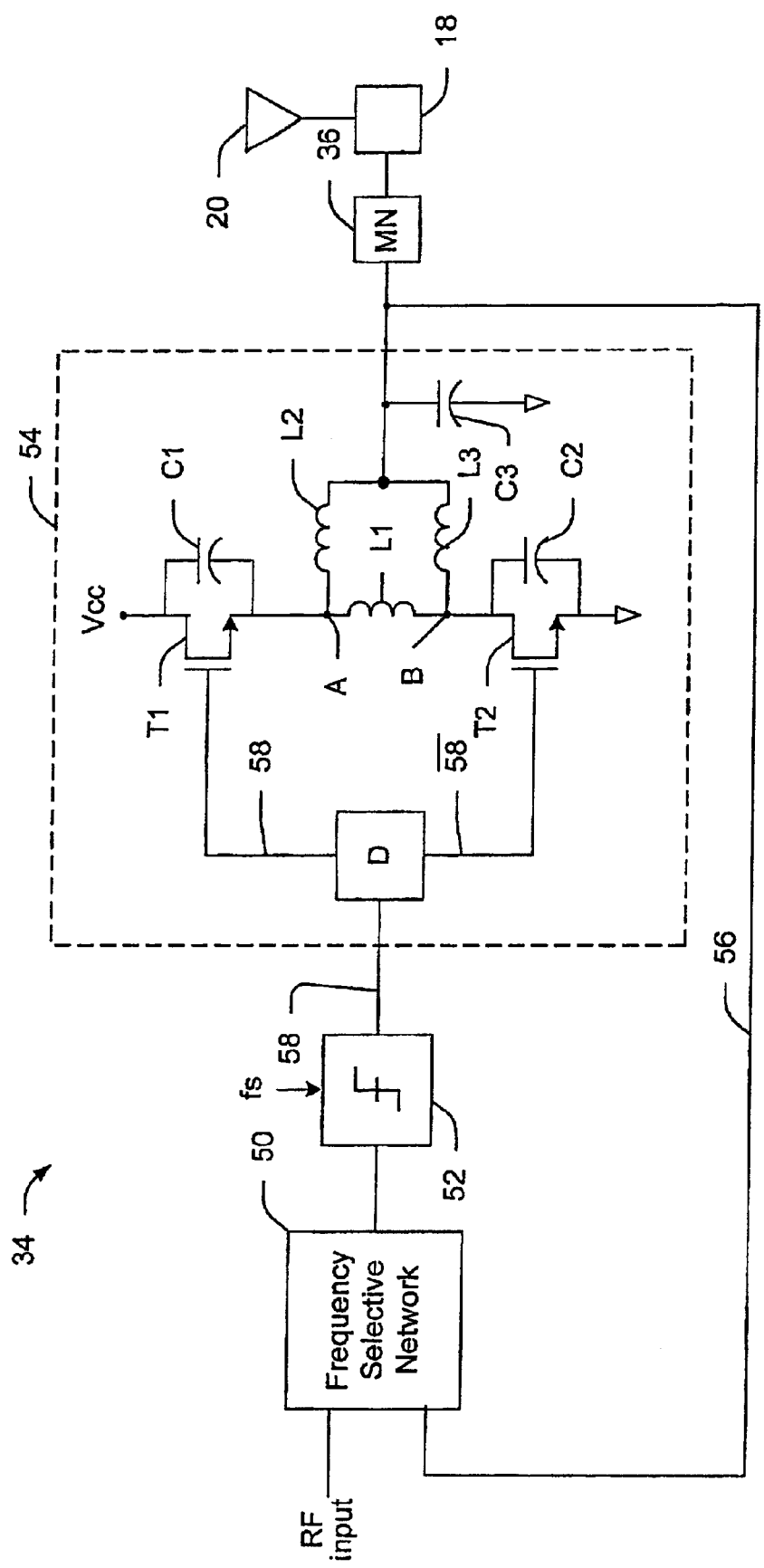
FIG. 2 is a circuit diagram of a digital linear RF power amplifier according to a specific embodiment of the present invention.

Referring to FIG. 2, a circuit diagram of a digital RF power amplifier 34 designed according to a specific embodiment of the present invention is shown. According to various specific embodiments, amplifier 34 may be designed in accordance with the techniques described in U.S. Pat. No. 5,777,512 for METHOD AND APPARATUS FOR OVERSAMPLED, NOISE-SHAPING, MIXED-SIGNAL PROCESSING issued on Jul. 7, 1998, the entire disclosure of which is incorporated herein by reference for all purposes. Amplifier 34 includes a frequency selective network 50 with a high Q at the desired transmission frequency, an analog-to-digital converter (A/D) 52, an output stage 54, and a feedback loop 56 which provides a continuous-time feedback signal from the output stage 54 to the frequency selective network 50. The A/D converter 52 samples the output of the frequency selective network 50 and generates a digital signal at 58 which is provided to the output stage 54. In one embodiment, the A/D converter 52 is a comparator that samples at a frequency (fs) of 3.6 GHz for applications where a transmit band of 900 MHz is desired. In an alternate embodiment, the sampling frequency (fs) can range from a minimum of 1.8 GHz to 3.6 GHz or higher for the transmission of a 900 MHz signal. In general, the sampling frequency (fs) should be at a minimum approximately 2× and preferably at least 4× the desired transmission frequency.

One possible implementation of the output stage 54 includes two transistors T1 and T2, inductors L1, L2, and L3, capacitors C1, C2 and C3, and a pre-driver D. The pre-driver D is configured to buffer signal 58 and to provide signal 58 and its complement to the gates of the transistor T1 and the transistor T2, respectively. The drain of the transistor T1 is coupled to Vcc and the source is coupled to a node A. The capacitor C1 is typically the parasitic capacitor between the source and drain of the transistor T1. The drain of the transistor T2 is coupled to a node B and the source is coupled to ground. The capacitor C2 is typically the parasitic capacitor between the source and drain of the transistor T2. The inductor L1 is coupled between the node A and the node B, and the inductors L2 and L3 are coupled between the capacitor C3 and the nodes A and B, respectively.

During operation, the digital signal 58 generated by the A/D converter 52 transitions between high and low levels in accordance with the information being transmitted. Since the signal 58 and its complement are provided to the gates of the transistors T1 and T2 respectively, one transistor is on and the other is off depending on the state of the signal 58. When the signal 58 transitions low level for example, T1 turns off and 77 turns on. When this occurs, node A resonates due to the formation of a resonating circuit within the output stage 54. This resonating circuit is formed by C1, the three inductors L1, L2, and L3, and node B which is pulled to ground through T2. Driver circuit 54 thus in effect contains two separate resonators at nodes A and B. Depending on the state of signal 58, one node resonates while the other is clamped. In one embodiment, the resonators are tuned to resonate at the sampling frequency of 3.6 GHz. This is accomplished by selecting the values of inductors L1, L2, and L3 and capacitors C1, C2 and C3. According to a specific embodiment, C3 is selected to bypass an undesired frequency component outputted from the output stage 54.

The output of the switching stage 54 is provided to the matching network 36 which acts as a bandpass filter operating at the transmit band (e.g., 824–849 MHz). Since the antenna 20 transmits at the 900 MHz band in the above-described embodiment, the "tracking" function of the matching network 36 needs to match this frequency. In one embodiment, this is accomplished by selecting the values of L1, L2, and L3, and C3 so that the resonance circuit has a transfer function looking into matching network 36 of approximately 900 MHz so that the output bit pattern ie is generated by T1 and T7 has an energy component at the transmit band. In other words, the matching network 36 has to provide a signal pass rate sufficient to make sure that the bit pattern has sufficient energy at the transmit band for the impedance of the antenna 20 (which is typically 50 ohms).

In another embodiment, the matching network 36 uses the bond wires on the chip containing the power amplifier 34 and other passive components, to create a matching network to provide optimal power transfer to the antenna 20 and to transform the impedance of the antenna 20 to an impedance where the desired power level can be achieved from a given supply voltage. This requires a relatively high Q filter that has a relatively narrow band. In yet another embodiment, the power amplifier 34 is designed to have a bridged output. In applications where the antenna 20 has a single ended output, a BALUN (balance-to-unbalance transformer or a passive LC combiner may be used.

One potential problem with the power amplifier 34 when used in a cell phone application relates to the act that the transmitted power includes switching energy in the receive band which has the potential to desensitize the associated or any nearby receivers. Thus, for both FDD and TDD applications, there are limits relating to the maximum allowable transmit energy in the receive band. The present invention provides a number of solutions for addressing this problem, and has advantages especially for the FDD applications to meet the receive band noise requirements associated with the FDD system.

Figure 3:
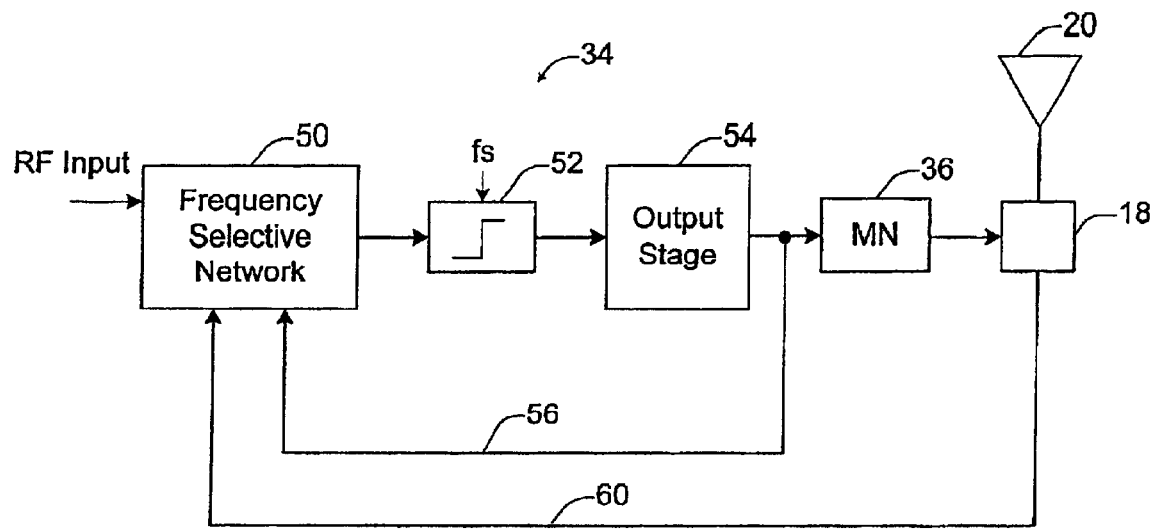
FIG. 3 is a circuit diagram of another embodiment of the digital linear RF amplifier designed to reject unwanted band information received at the antenna of a cell phone according to a specific embodiment of the present invention.

Referring to FIG. 3, a circuit diagram of another embodiment of a digital RF amplifier designed according to the present invention is shown. In this embodiment, the amplifier 34 includes a feedback loop 60 between the frequency selective network 50 and the duplexor 18. The frequency selective network 50 includes both a first resonator circuit designed to resonate at the transmit band and a second resonator circuit designed to resonate at the receive band. Since the other components, including the A/D converter 52, the output stage 54, and the matching network 36 operate the same as provided above, a detailed explanation of these elements is not provided herein.

Figure 4:
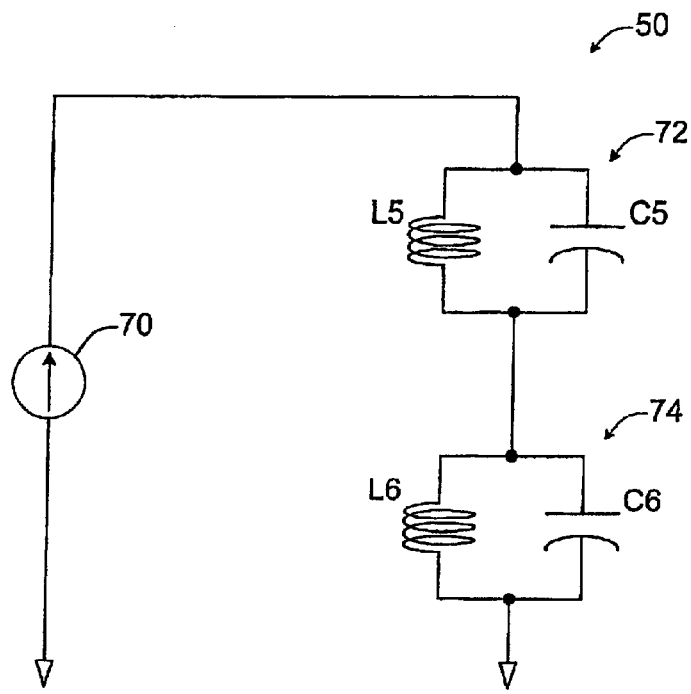
FIG. 4 is a circuit diagram of frequency selective network for use in a digital RF amplifier designed according to a specific embodiment of the present invention.

Referring to FIG. 4, a simplified schematic representation of a specific embodiment of the frequency selective network 50 is shown. The frequency selective network 50 includes a current source 70, a first resonator circuit 72 including an inductor L5 and a capacitor C5, and a second resonator circuit 74 including an inductor L6 and a capacitor C6. The resonator circuit 72 is designed, by selecting the appropriate values of L5 and C5, to resonate at the transmit band frequency and to short at other frequencies. The resonator circuit 74 is configured to resonate at the receive band frequency, also by selecting the appropriate values of L6 and C6, and to short at other frequencies. Thus, the frequency selective network 50 shapes the signals passing through the network by removing components of the receive band from the transmit band and vice versa. The matching network 36, which is a bandpass filter tuned at the transmit band, prevents any receive band information passing through the output stage 54 from being transmitted by the antenna 20. It should be noted that the circuit of FIG. 4 is only exemplary, and that a wide variety of wave shaping circuits that perform similar functions may be used to implement various embodiments of the invention.

As discussed above with reference to amplifier 34 of FIG. 2, switching noise is spread out of the transmit band by modulator noise shaping. And because for some FDD applications (e.g., IS-95 CDMA systems) the emission requirements in the receive band are typically much lower than the adjacent channel emissions in the transmit band (due to the proximity of the associated receivers), specific embodiments of the present invention provide amplifiers suited for reducing transmit emissions in the receive band. More specific embodiments of the present invention also maximize dynamic range in the transmit band to achieve maximum efficiency. A generalized loop structure for such an amplifier 500 is shown in FIG. 5.

The amplifier 500 is a specific implementation of the amplifier 34 of FIG. 2 in which a TX filtering section 502 comprises a resonator (e.g., 502-1) tuned to the center of the TX band (e.g., 824–849 MHz for IS-95 applications) and an RX filtering section 504 comprises two resonators (e.g., 504-1 and 504-2) tuned to the center of the RX band (e.g., 869–894 MHz for IS-95 applications). The sampling and power stages of amplifier 500 are shown as a block 506 for discussion purposes. It will be understood, however, the block 506 may be implemented in a variety of way such as, for example, using the A/D converter 52 and the output stage 54 of the amplifier 34 of FIG. 2, without departing from the scope of the invention.

Figure 5:
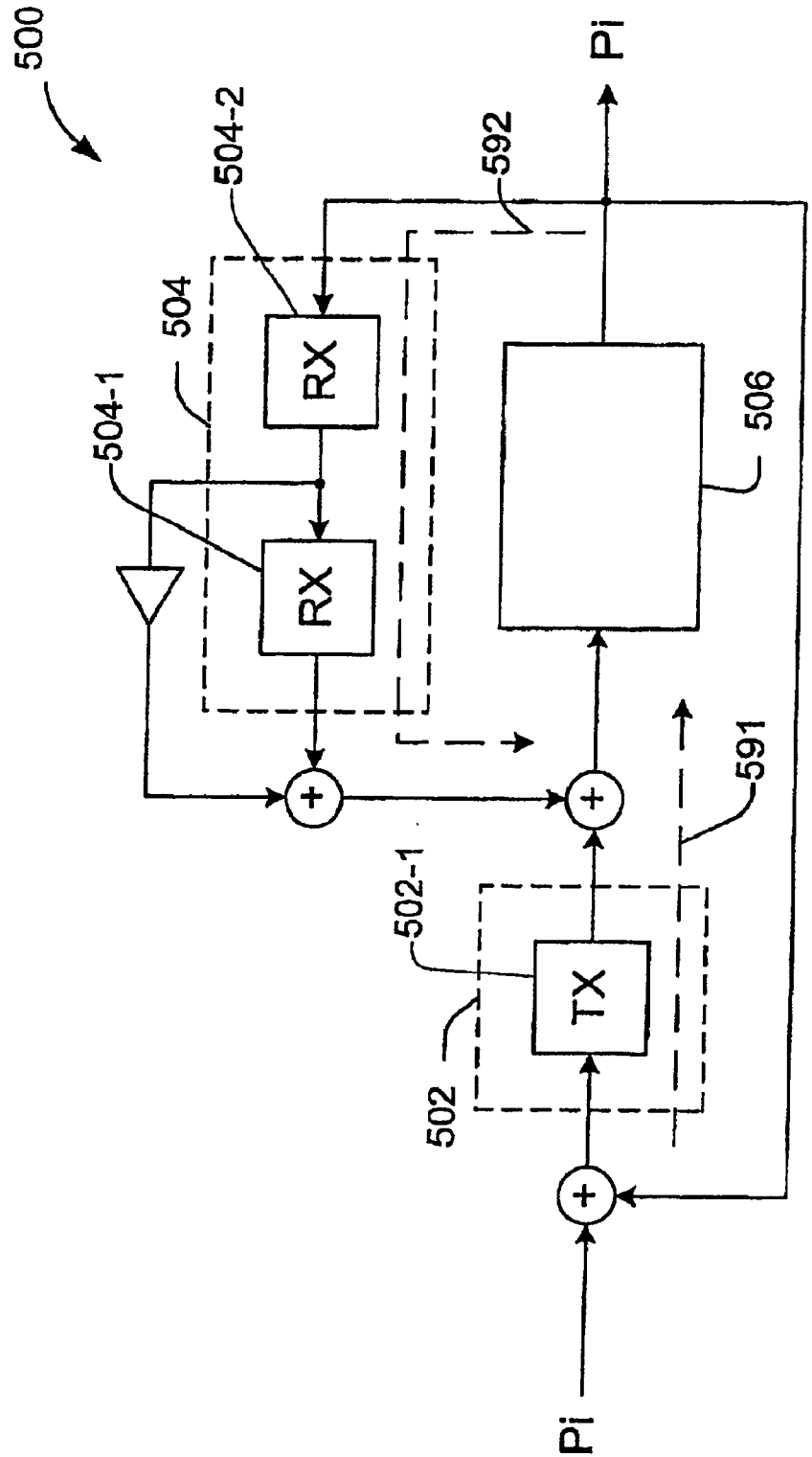
FIG. 5 is a generalized block diagram of an amplifier designed according to a specific embodiment of the present invention.

The transmit signal is processed through the TX filtering section 502 which, according to various embodiments of the invention, is of a lower order than the RX filtering section 504 (e.g., first order vs. second order as shown in FIG. 5). This is related to the fact that the maximum input signal level at which stable noise shaping is achieved has an inverse relationship with the order of the TX filtering section. The specific filter and feedback configuration of FIG. 5 was shown empirically to maximize the input signal for a noise-shaping amplifier configured as shown in FIG. 2. It will of course be understood that embodiments of the invention are contemplated in which the order of the TX filtering section is not lower than that of the RX filtering section, i.e., that there are variety of different combinations of various order filters for different amplifier configurations which are within the scope of the invention.

Figure 6:
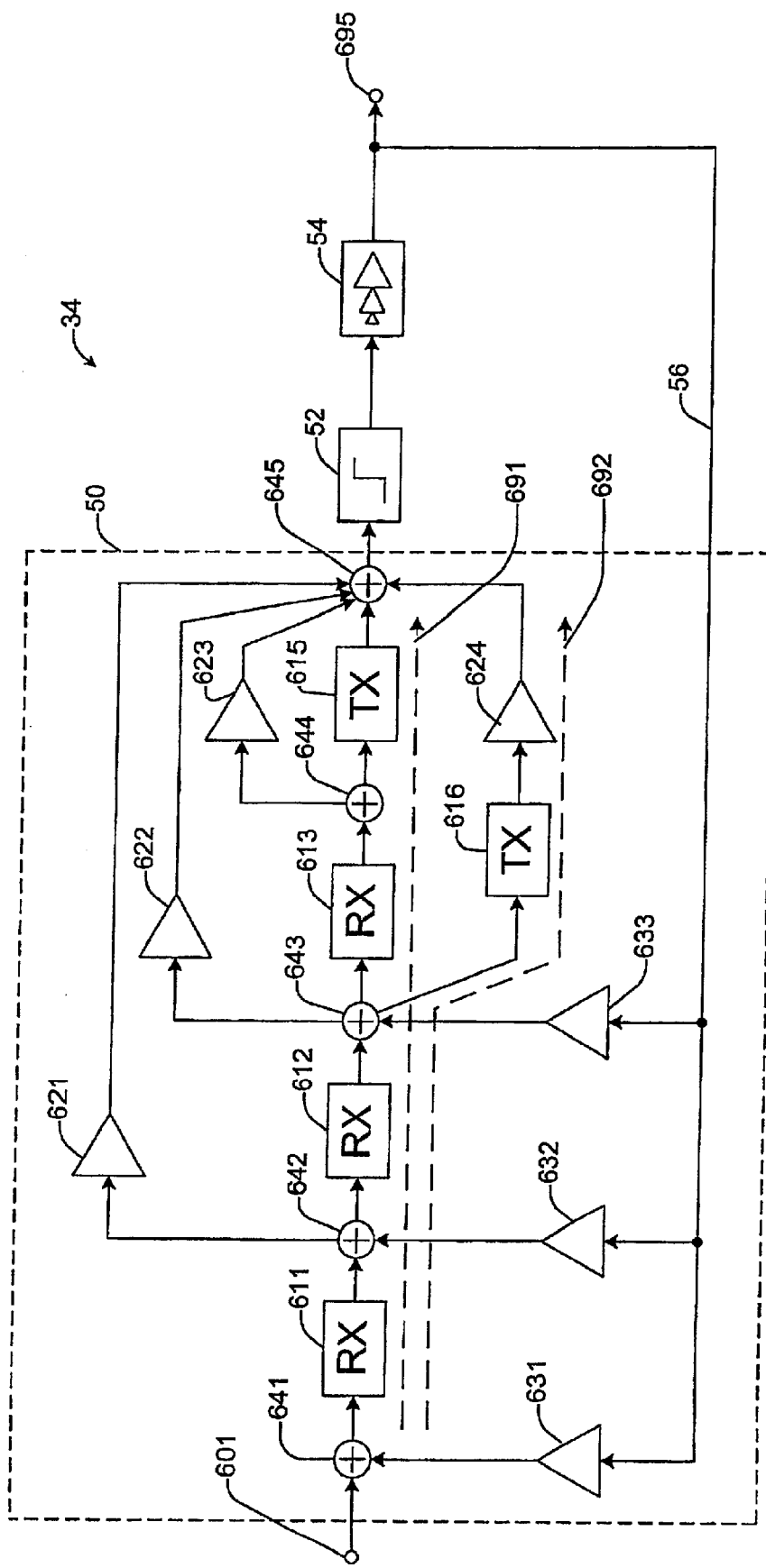
FIG. 6 is a block diagram of an embodiment of the amplifier according to a specific embodiment of the present invention.

The bandpass amplifier 500 of FIG. 5 includes a first signal path 591 which is a feedforward path including the transmit band resonator 502-1, and a second signal path 592 which is a feedback path including the receive band resonators 5041 and 504-2. It should be understood that the amplifier 500 used for the embodiment of the present invention may include (i) a first signal path including a first number of transmit band resonators operable to resonate at the transmit band, and a second number of receive band resonators operable to resonate at the receive band; and (ii) a second signal path including a third number of transmit band resonators operable to resonate at the transmit band, and a fourth number of receive band resonators operable to resonate at the receive band, wherein (iii) the difference between the first and third numbers is equal to or less than two, and (iv) the difference between the second and fourth numbers is equal to or less than two. In the case of FIG. 5, the first, second, third and fourth numbers are one, zero, zero and two, respectively, and thus, the conditions (iii) and (iv) above are met FIG. 6 illustrates an Embodiment of the amplifier 34 of FIG. 1. The amplifier 34 includes the frequency selective network 50, the A/D converter 52, the output stage 54, and the feedback loop 56, which function in a similar manner described in connection with FIGS. 1–3. Thus, a detailed explanation of all of these elements is not provided herein.

A node 601 receives an RF input signal from, for example, the output of the matching network 32. The frequency selective network 50 enables the RF input signal at the node 601 to pass through (i) a first signal path 691 including receive band resonators 611–613 and a transmit band resonator 615; and (ii) a second signal path 692 including receive band resonators 611 and 612 and a transmit band resonator 616. The transmit band resonators 615 and 616 are operable to resonate at the transmit band, and the receive band resonators 611–613 are operable to resonate at the receive band.

In FIG. 6, the first signal path 691 has feedforward paths including coefficient elements 621–623 coupled thereto, and feedback paths including coefficient elements 631–633 coupled thereto. The second signal path 692 has feedforward paths including coefficient elements 621–622 and 624 coupled thereto, and feedback paths including coefficient elements 631–633 coupled thereto. The feedback loop 56 has the coefficient elements 631–633 coupled thereto. The coefficient elements 621–623 and 631–633 amplify an input signal by a constant gain. The gain of the coefficient elements in this specific embodiment is unity (i.e., 1.0). However, it will be understood that the gain may be higher than 0 dB (i.e., positive gain), or lower than 0 dB (i.e., negative gain). When the second signal path 692 has two transmit band resonators instead of the transmit band resonator 616, the path 692 also may have a feedforward path similar to a path including the coefficient element 623. According to the present invention, at least one of the feedforward and feedback path may have a coefficient element. Values of the coefficient elements 621–624 and 631–633 are adjusted in order to reduce transmit emissions in the receive band and/or maximize dynamic range in the transmit band to achieve maximum efficiency.

The frequency selective network 50 used for the various embodiments of the present invention may include (i) a first signal path including a first number of transmit band resonators operable to resonate at the transmit band, and a second number of receive band resonators operable to resonate at the receive band; and (ii) a second signal path including a third number of transmit band resonators operable to resonate at the transmit band, and a fourth number of receive band resonators operable to resonate at the receive band, wherein (iii) the difference between the first and third numbers is equal to or less than two, and (iv) the difference between the second and fourth numbers is equal to or less than two. In this case shown in FIG. 6, the first, second, third and fourth numbers are one, three, one and two, respectively, thereby satisfying the conditions (iii) and (iv).

Each of the transmit and receive band resonators used for the embodiments of the present invention may be, for example, a first-order bandpass filter whose transfer function is generally expressed in the form of $1/(s^2+\omega_0^2)$, where (Do represents an angular resonant frequency of the filter. In this specification, the "number of transit/receive band resonators" is calculated based on the number of the first-order bandpass filter included in the signal path. In FIG. 6, each of the resonators 611–613 and 615–616 is a first-order bandpass filter configured to resonant at the corresponding frequency.

The first and second signal paths used for the frequency selective network 50 may have at least one of the receive band resonators in common. In the specific embodiment shown in FIG. 6, the first and second signal paths 691 and 692 of the frequency selective network 50 has the receive band resonators 611 and 612 in common. However, it should be understood that the first and second signal paths used for the frequency selective network 50 may have at least one of the transmit band resonators in common.

Each of adders 641–645 sums up inputted signals and outputs the resulting signal. For example, the adder 642 sums a signal from the receive band resonator 611 and a signal from the coefficient element 632, and outputs the added signal to the receive band resonator 612 and the coefficient element 621.

The A/D converter 52 coupled to the adder 645 converts an analog signal outputted from the adder 645 into a digital signal for driving the output stage 54. The output stage 54 amplifies the digital signal from the A/D converter 52 and outputs the amplified signal at a node 695. The node 695 corresponds to a node coupled to the input of the matching network 36 of, for example, FIGS. 1 and 2.

Figure 7:
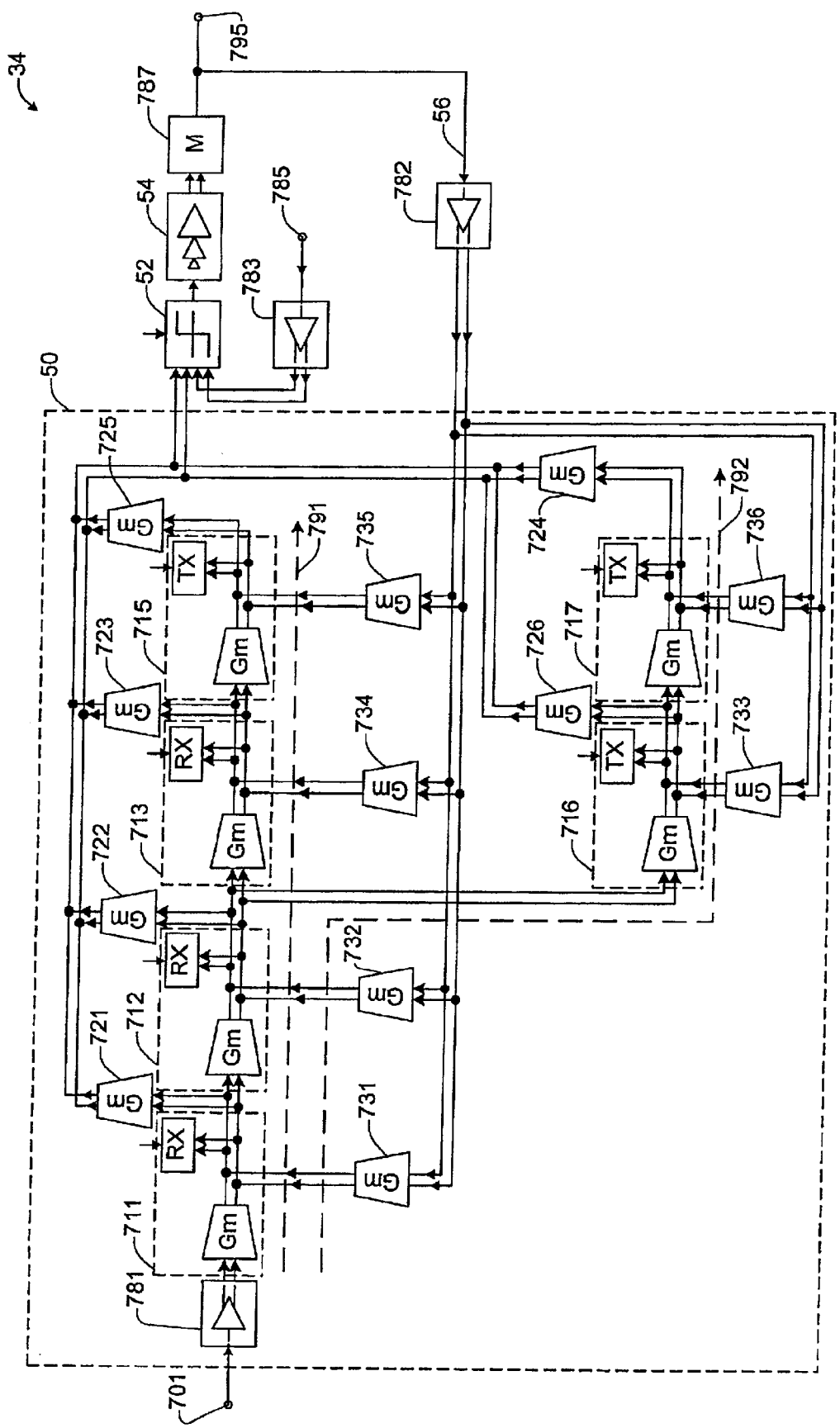
FIG. 7 is a schematic diagram of another embodiment of the frequency selective network used for the present invention.

FIG. 7 illustrates another embodiment of the frequency selective network 50 used for the present invention. The amplifier 34 includes the frequency selective network 50, the A/D converter 52, the output stage 54, and the feedback loop 56, which function in a similar manner described in connection with FIGS. 1–3 and 6. Thus, a detailed explanation of all of these elements is not provided herein.

The frequency selective network 50 shown in FIG. 7 also has a first signal path 791 and second signal path 792 similar to those of FIG. 6 with the exception that the first and second signal paths 791 and 792 are differentially driven (or balanced), and that the second signal path 792 has two transmit band resonators 716 and 717. Transmit band resonators 715–716, and receive band resonators 711–713 correspond to the transmit band resonators 615–616, and the receive band resonators 611–613. The frequency selective network of FIG. 7 utilizes the differentially driven (or balanced) first and second signal paths 791 and 792. Such an arrangement may be desirable where, for example, noise immunity is an issue.

Each of the transmit band resonators 715–717 and the receive band resonators 711–713 includes a transconductive element Gm implemented by, for example, an FET (field effect transistor), and a resonant element TX/RX implemented by, for example, an inductive element and a capacitive element. In order to adjust the resonant frequency of the resonator to the desired frequency, the capacitive element may include a bank of capacitors. In order to change the capacitance of the bank of capacitors, a switch may be used to selectively couple a part or all of the capacitors to the rest of the resonator.

Coefficient elements 721–724 and 731–733 correspond to the coefficient elements 621–624 and 631–633, respectively. Coefficient elements 725–726 and 734–736 function in a similar manner as the coefficient elements 721–724 and 731–733 do. Each of the coefficient elements 721–726 and 731–736 includes a transconductive element Gm implemented by, for example, an FET.

A node 701 receives an RF input signal from, for example, the output of the matching network 32. The frequency selective network 50 enables the RF input signal at the node 701 to pass through (i) the first signal path 791 including receive band resonators 711–713 and the transmit band resonator 715; and (ii) the second signal path 792 including the receive band resonators 711 and 712 and the transmit band resonators 716 and 717, The transmit band resonators 715–717 are operable to resonate at the transmit band, and the receive band resonators 711–713 are operable to resonate at the receive band.

The first signal path 791 has feedforward paths including coefficient elements 721–723 and 725 coupled thereto, and feedback paths including coefficient elements 731–732 and 734–735 coupled thereto. The second signal path 792 has feedforward paths including coefficient elements 721–722, 724 and 726 coupled thereto, and feedback paths including coefficient elements 731–733 and 736 coupled thereto. The feedback loop 56 has the coefficient elements 731–736 coupled thereto. The coefficient elements 721–726 and 731–736 amplify an input signal by a constant gain. The gain of the coefficient elements in this specific embodiment is unity (i.e., 1.0). However, it will be understood that the gain may be higher than 0 dB (i.e., positive gain), or lower than 0 dB (i.e., negative gain). According to the present invention, at least one the feedforward and feedback path may have a coefficient element. Values of the coefficient elements 721–726 and 731–736 are adjusted in order to reduce transmit emissions in the receive band and/or maximize dynamic range in the transmit band to achieve maximum efficiency.

The frequency selective network 50 used for the embodiment of the present invention may include (i) a first signal path including a first number of transmit band resonators operable to resonate at the transmit band, and a second number of receive band resonators operable to resonate at the receive band; and (ii) a second signal path including a third number of transmit band resonators operable to resonate at the transmit band, and a fourth number of receive band resonators operable to resonate at the receive band, as long as (iii) the difference between the first and third numbers is equal to or less than two, and (iv) the difference between the second and fourth numbers is equal to or less than two. In this case shown in FIG. 7, the first, second, third and fourth numbers are one, three, two and two, respectively, thereby satisfying the conditions (iii) and (iv).

The first and second signal paths used for the frequency selective network 50 may have at least one of the receive band resonators in common. In the specific embodiment shown in FIG. 7, the first and second signal paths 791 and 792 of the frequency selective network 50 have the receive band resonators 711 and 712 in common.

The A/D converter 52, the output stage 54, the output loop 56, and a node 695 shown in FIG. 7 function similar to those described above in connection with FIG. 6. Converters 781–783 convert a single–ended (or unbalanced) input signal into differentially driven (or balanced) output signals in a manner well known in the art. The converter 783 receives a single-ended offset signal at a node 785, converts the offset signal into differentially driven offset signals, and outputs the balanced offset signals to the A/D converter 52. A matching network 787 receives differentially driven signals from the output stage 54, converts the signals into a single-ended signal, and outputs the single-ended signal to a node 795 and the feedback loop 56.

Figure 8:
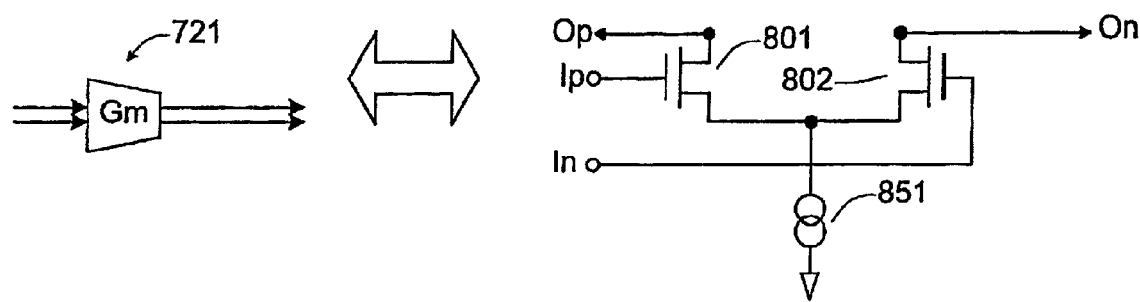
FIG. 8 is a schematic diagram of the exemplary implementation of the coefficient elements.

FIG. 8 illustrates an exemplary implementation of the coefficient elements shown in FIG. 7. Each of the coefficient elements 721–726 and 731–736 (collectively referred to as 721 in FIG. 8) includes a pair of FETs 801 and 802 which function as transconductance elements, and a current source 851. Input nodes Ip and In, and output nodes Op and On shown in FIG. 8 are driven differentially.

Figure 9:
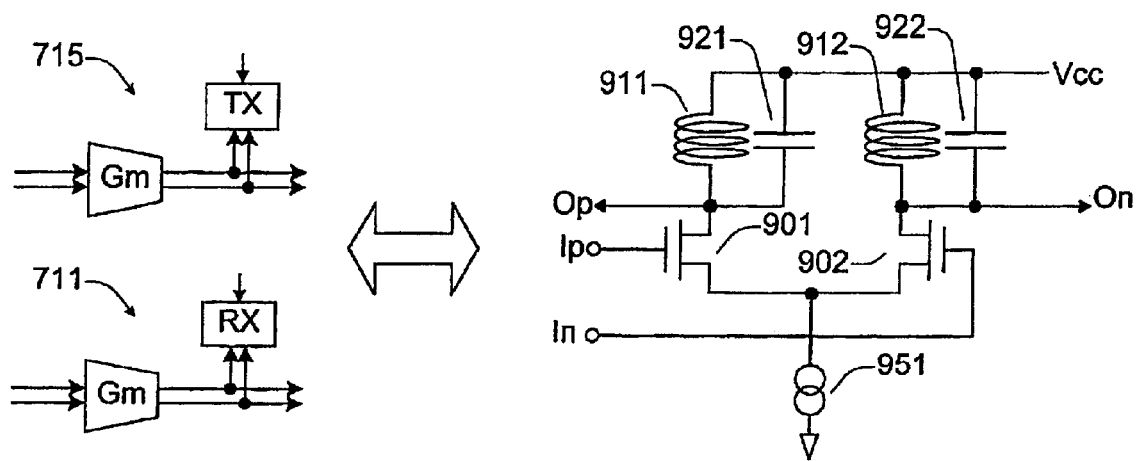
FIG. 9 is a schematic diagram of the exemplary implementation of the transmit/receive band resonators.

FIG. 9 illustrates an exemplary implementation of the transmit/receive band resonators shown in FIG. 7. Each of the transmit/receive band resonators 715–717 and 711–713 (collectively referred to as 715 and 711 in FIG. 9) includes a pair of FETs 901 and 902 which function as transconductance elements, and inductive elements 911 and 912, capacitive elements 921 and 922, and a current source 951. Input nodes Ip and In, and output nodes Op and On shown in FIG. 9 are driven differentially.

It should be understood that the transconductance elements used for the coefficient elements and the transmit/receive band resonators in the embodiments of the present invention may be implemented by various kinds of semiconductor devices other than the above-mentioned FETs. Those semiconductor devices may be incorporated onto a semiconductor chip with other circuit components.

Figure 10:
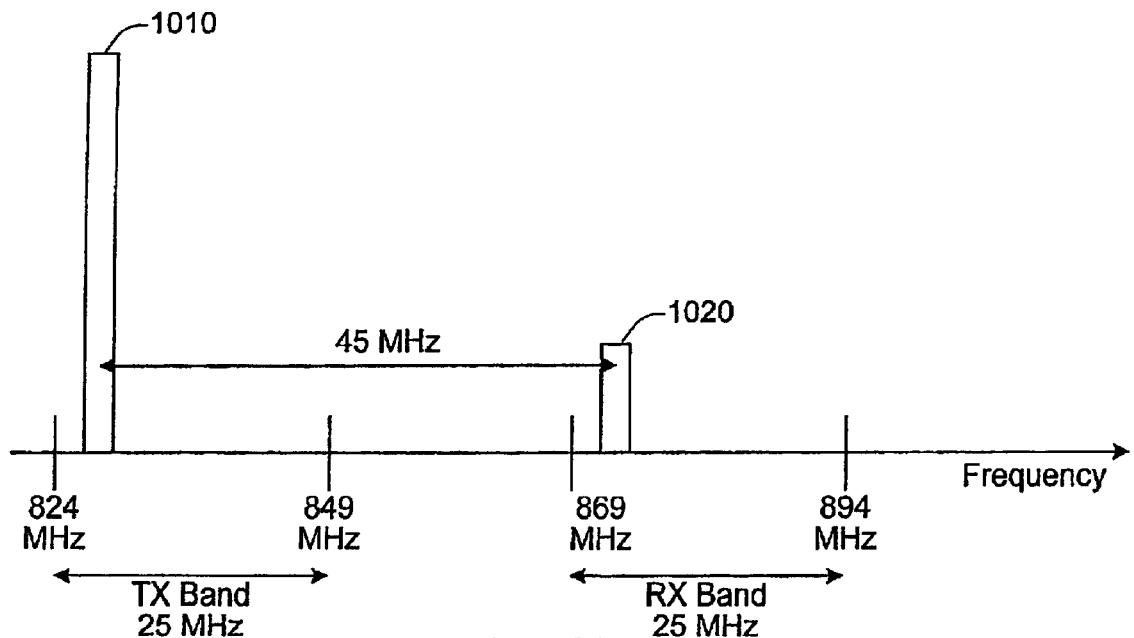
FIG. 10 is a diagram illustrating a transmit and receive band allocation for IS-95.

FIG. 10 illustrates a transmit and receive band allocation for IS-95, which is a typical FDD system. A transmit channel 1010 is used for transmission from a mobile station to a base station, and a receive channel 1020 is used for transmission from a base station to a mobile station. The transmit band (e.g., 824–849 MHz) and the receive band (e.g., 869–894 MHz) used for IS-95 have 25 MHz width, and are divided into frequency channels each of which has 1.25 MHz width. The transmit and receive channels transmit data for different mobile users with uncorrelated pseudo-noise (PN) sequences.

When a particular transmit frequency channel is allocated to a mobile station, which typically is a cellular phone, the receive channel for the mobile station is set at a fixed offset, e.g., 45 MHz, from its transmit frequency. In FIG. 10, for example, the frequency for the receive channel 1020 (i.e., 825 MHz) is higher than the frequency for the transmit channel 1010 (i.e., 870 MHz) by 45 MHz.

Figure 11:
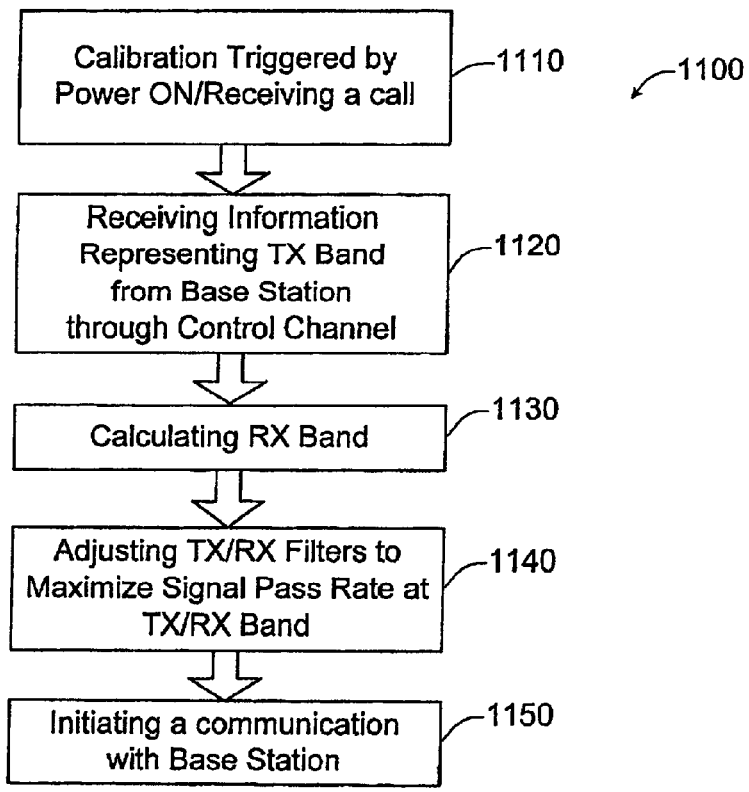
FIG. 11 is a flowchart of a method for calibrating the transmit/receive band resonators used in the frequency selective network according to a specific embodiment of the present invention.

FIG. 11 illustrates a flowchart 1100 of a method for calibrating the transmit/receive band resonators used in the frequency selective network 50 according to a specific embodiment of the present invention. At 1110, the calibration process according to the present invention is triggered by either turning power of the mobile phone on or receiving a signal from a base station.

At 1120, a controller in the mobile phone receives information representing the transmit band from the base station through a fixed control channel (or a paging channel). The transmit band information is represented in the form of digital words sent from the base station.

At 1130, the controller calculates the receive band based on the transmit band information and a fixed frequency offset between the transmit and receive bands, which is 45 MHz in this specific embodiment. For example, if the transmit band frequency is 825 MHz, then the receive band frequency would be 870 MHz.

At 1140, the controller in the mobile phone adjusts each of the transmit and receive band resonators to the transmit and receive band frequencies in order to maximize signal pass rate at the transmit band and the receive band, respectively. According to some embodiments, this adjustment of the transmit and receive band resonators is performed by the controller for each and every resonator one-by-one. However, according to other embodiments, the adjustment of resonators may be done for only a part of the resonators included in the system.

At 1150, after the transmit and receive band resonators are tuned to the corresponding transmit band frequency and receive band frequency, respectively, the mobile station initiates the "normal" communication with the base station, which typically contains digitally represented voice data.

The method according to the present invention shown in FIG. 11 is capable of adjusting all of the transmit and receive band resonators separately on a one-by-one basis. Further, the adjustment is performed automatically right before each communication between the mobile station and the base station begins. Such a scheme may be desirable where, for example, the mobile station uses the FDD mode.

Figure 12:
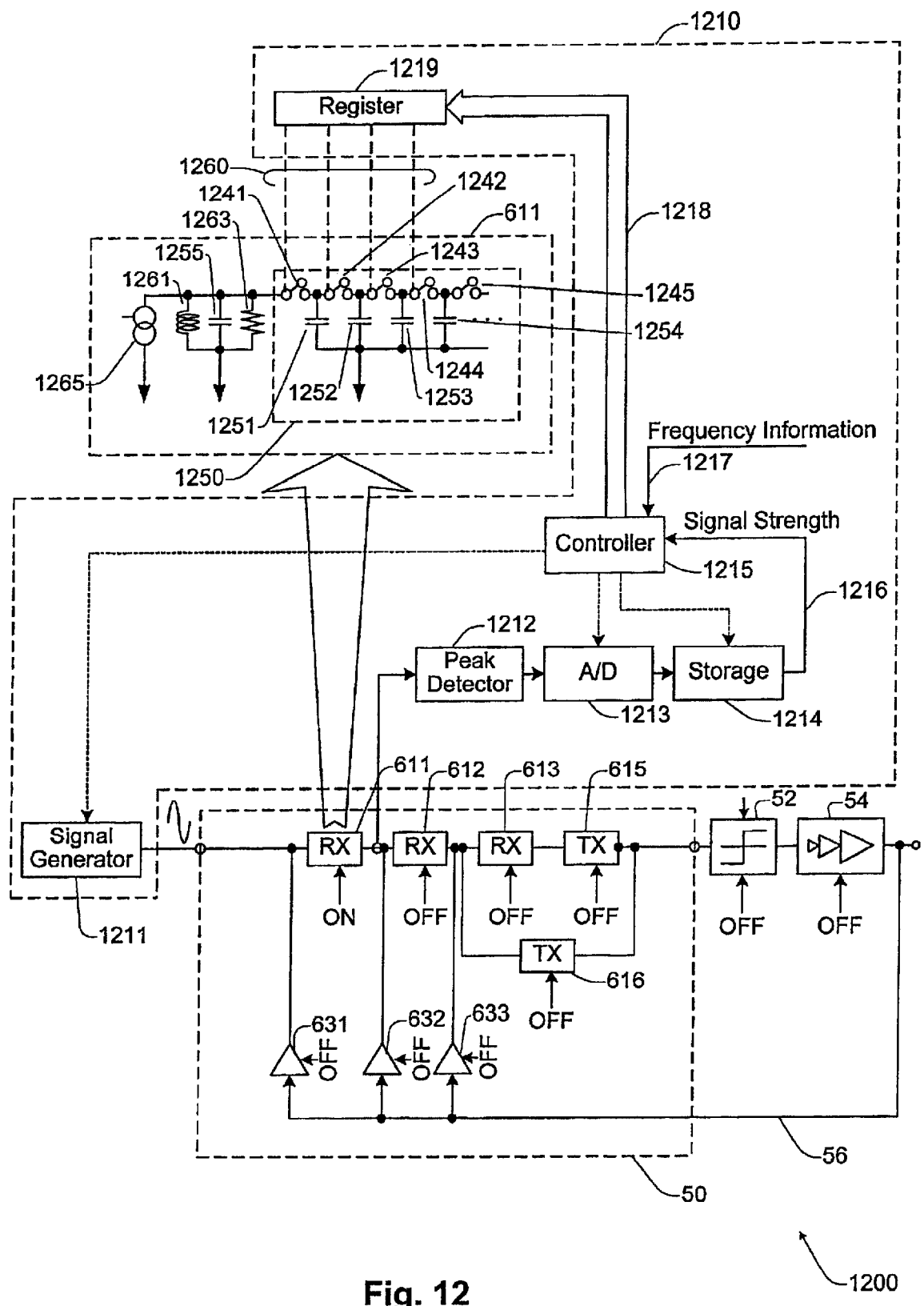
FIG. 12 is a schematic diagram of a communication system according to a specific embodiment of the present invention.

FIG. 12 illustrates a schematic diagram of a communication system 1200 according to a specific embodiment of the present invention which enables a calibration unit 1210 to adjust the transmit and receive band resonators to the transmit and receive frequencies, respectively. The communication system 1200 includes the frequency selective network 50, the A/D converter 52, the output stage 54, and the calibration unit 1210. The receive band resonator 611 is illustrated in an enlarged manner as indicated by an arrow.

The calibration unit 1210 includes a signal generator 1211, a peak detector 1212, an A/D converter 1213, a storage medium 1214, a controller 1215, and a register 1219. The signal generator 1211 generates a test signal having a frequency to which a resonator is tuned. For example, when the receive band resonator 611 is to be calibrated to 870 MHz which is used for transmission from a mobile station to the base station, the signal generator 1211 applies a test signal of 870 MHz to the receive band resonator 611.

Here, the calibration (or adjustment) process of the receive band resonator 611 will be described first as a part of the entire process. The peak detector 1212 is selectively coupled to a resonator which is to be calibrated, namely, the receive band resonator 611, and detects a peak-to-peak level of the test signal passed through the resonator which is to be calibrated. Both the signal generator 1211 and the peak detector 1212 are selectively coupled to an input and an output of a resonator which is to be calibrated, respectively, and are decoupled from the other resonators.

It is noted that the circuit components other than the resonator to be calibrated are decoupled from the peak detector 1212. Specifically, the receive band resonators 612, 613, 615 and 616, the coefficient elements 631–633, the A/D converter 52, and the output stage 54 are disabled by cutting off electric power supplied to these components. This selective coupling of a resonator enables the peak detector 1212 to detect a precise peak value of the test signal through the resonator to be calibrated, by eliminating the effects from the rest of the circuit components.

The A/D converter 1213 receives an output from the peak detector 1212, and converts the analog signal into a digital value for digital processing by the controller 1215. The storage medium 1214 receives the digital value representing the peak value of the test signal, and stores the digital value in response to a write command from the controller 1215. The storage medium 1214 outputs the stored value to the controller 1215 in response to a read command from the controller 1215. The storage medium 1214 is a semiconductor memory, such as a RAM (random access memory).

Figure 13:
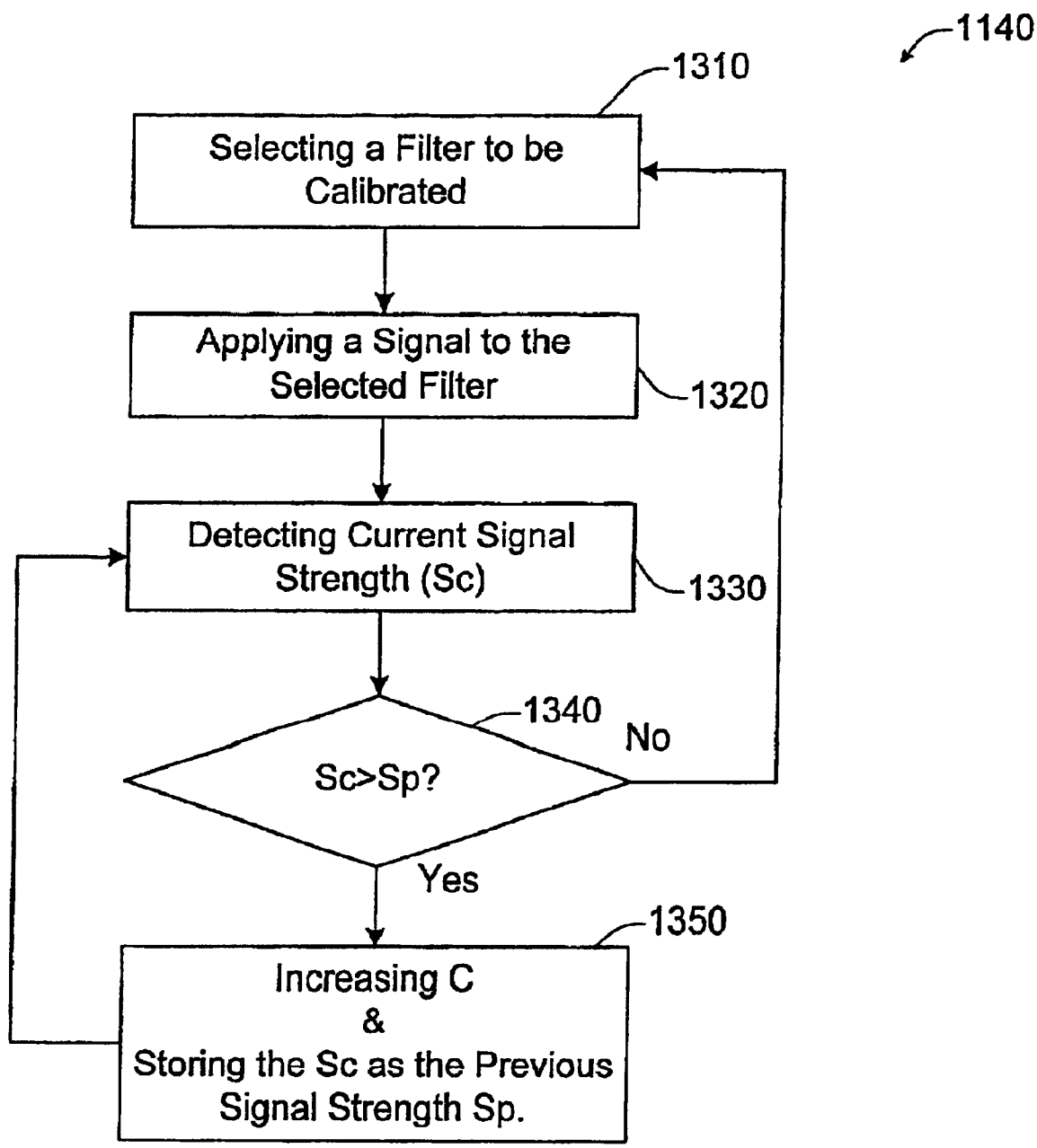
FIG. 13 is a flowchart of the calibration scheme according to a specific embodiment of the present invention.

The controller 1215 controls the signal generator 1211, the A/D converter 1213, the storage medium 1214, and the register 1219 in order to calibrate each of the resonators one by one. FIG. 13 illustrates one possible implementation of the calibration scheme 1140 in FIG. 11. As described in connection with 1120 of FIG. 11, the controller 1215 receives the information representing a transmit band from the base station, and calculates the receive band frequency. Thus, right before 1140, the controller 1215 has obtained information representing both the transmit and receive band frequencies through a data line 1217 which is coupled to, for example, a baseband chip (described later referring to FIG. 14).

At 1310, the controller 1215 in the calibration unit 1210 selects a resonator (or a filter) which is to be calibrated in the first and second signal paths. For example, the receive band resonator 611 is selected among the resonators 611–613, 615 and 616 for calibration. The controller 1215 couples the output of the signal generator 1211 to the input of the resonator 611, and couples the output of the resonator 611 to the input of the peak detector 1212. Also, the controller 1215 decouples other circuit components in the frequency selective network 50, the A/D converter, and the output stage 54 by cutting off the power supply. In FIG. 12, the arrow associated with "ON" designates the activated power line, and the arrows associated with "OFF" designate the deactivated power lines.

Here, the resonator 611 is one of the receive band resonators, and thus, at 1320, the controller 1215 causes the signal generator 1211 to generate a test signal having the same frequency as that of the receive band frequency, for example, 870 MHz. At 1330, the controller 1215 detects a current signal strength Sc through a data line 1216. Suppose the storage medium 1214 stores 0 (zero) as an initial value for a previous signal strength Sp. At 1340, the controller 1215 compares the current signal strength Sc with the previous signal strength Sp. If the current signal strength Sc is larger than the previous signal strength Sp, then the control proceeds to 1350. Otherwise, the control proceeds back to 1310. Here, the current signal strength Sc is larger than the previous signal strength Sp. Thus, the control moves to 1350.

The relationship of Sc>Sp means that the resonant frequency of the receive band resonator 611 is higher than the test signal. At 1350, the controller 1215 causes the register 1219 to increase the capacitance which governs the resonant frequency of the resonator 611 through a data bus 1218. The register 1219 makes or breaks switches 1241–1245 through control lines 1260 based on the data sent from the controller 1215 through the data bus 1218. The switches 1241–1245 changes the total capacitance included in the receive band resonator 611, which is a sum of capacitors 1251–1255 included in a capacitor bank 1250. The resonant frequency of the resonator 611 is determined by an inductive element 1261, and the capacitors 1251–1255. The resonator 611 also includes a resistive element 1263 and a current source element 1265.

Suppose the switches 1241–1245 are all open in the initial condition. If Sc>Sp, i.e., the resonant frequency of the resonator 611 is higher than the test signal generated by the signal generator 1211, then the controller 1215 lowers the resonant frequency by increasing the capacitance of the capacitor bank 1250. Specifically, the controller 1215 causes the switch 1241 to be closed through the register 1219 so that the capacitance of the resonator 611 is increased by the capacitance of the capacitor 1251.

Then, the controller 1215 stores the current signal strength Sc as the previous signal strength Sp for later calculation. The process goes back to 1330. At 1330, the controller 1215 detects the current signal strength Sc. Suppose at 1340, Sc=Sp or Sc<Sp. Then, the process returns to 1310. When the relationship Sc>Sp is not satisfied, the resonance frequency of the resonator 611 is deemed to be adjusted to the test signal which is the same as that of the receive frequency. Therefore, if the decision at 1340 is No, the calibration of the resonator 611 deemed to be completed. Unless the calibration is completed, the capacitance of the capacitor bank 1250 is increased monotonously by adding capacitors 1252–1254 one by one.

When the calibration of the resonator 611 is completed, the controller 1215 selects a new resonator which is to be calibrated, and begins the whole calibration process shown in FIG. 13 from 1310 for the new resonator. By repeating this calibration scheme for all of the resonators, the transmit and receive band resonators in the frequency selective network 50 are adjusted to the transmit and receive band frequencies, respectively.

The calibration unit 1210 of the communication system shown in FIG. 12 is provided within a package which contains other circuit components, such as the A/D converter 52 and the output stage 54. However a part or all of the calibration unit 1210 may be provided in a separate package as a discrete unit.

Figure 14:
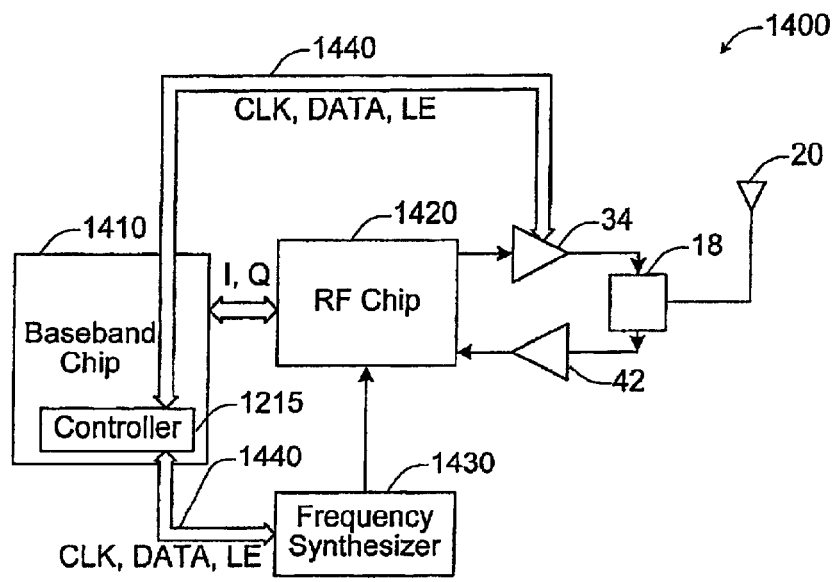
FIG. 14 is a block diagram illustrating another embodiment of the communication system according to the present invention.

FIG. 14 illustrates another embodiment of the communication system 1400 according to the present invention. The system 1400 includes a baseband chip 1410, an RF chip 1420, and a frequency synthesizer 1430 in addition to the power amplifier 34, the LNA 42, the duplexor 18, and the antenna 20 described referring to FIGS. 1–13. The controller 1215 is provided in the baseband chip 1410, and the rest of the components constituting the calibration unit 1210 are provided in the amplifier 34. The controller 1215 and the amplifier 34 are coupled by a serial data bus 1440, and the controller 1215 and the frequency synthesizer 1430 are also coupled by the serial data bus 1440. The serial data bus may be an $I^2C$ bus, but is not limited to this specific bus. The functionality of the controller 1215 is implemented by hardware, software or combination of both.

Figure 15:
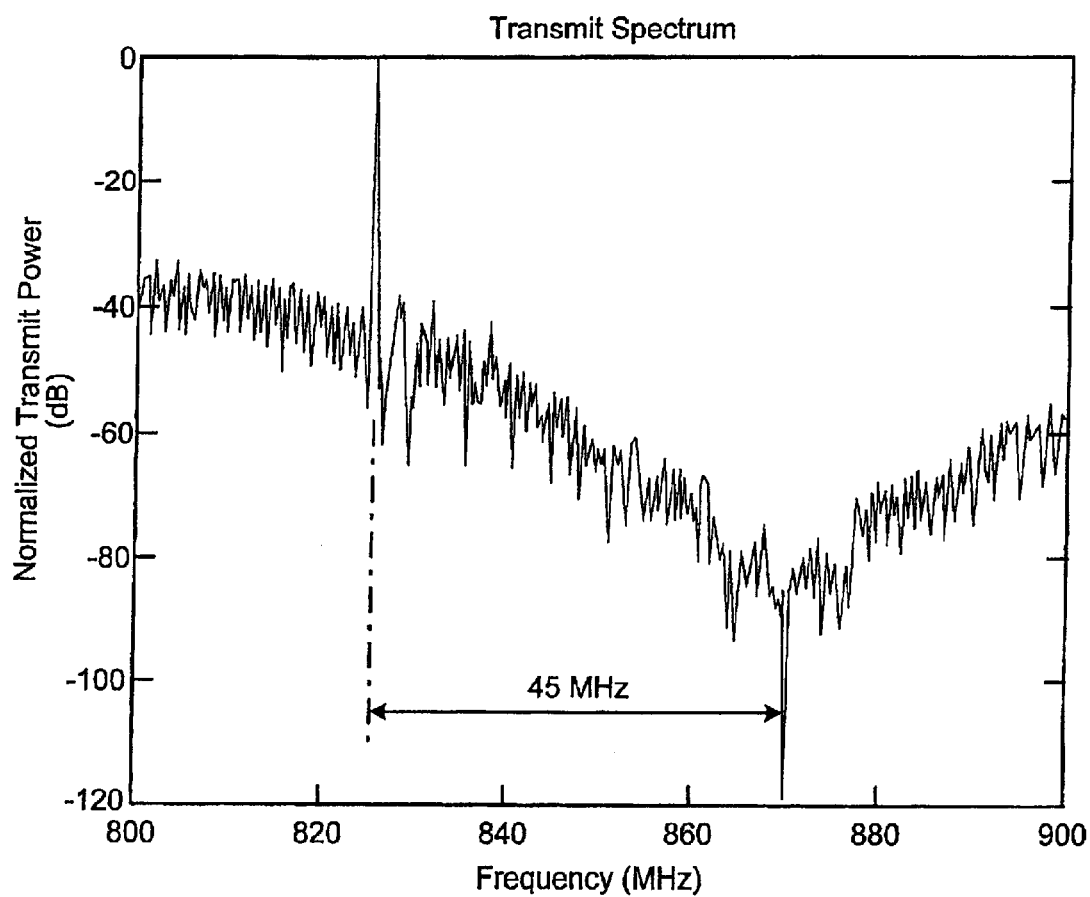
FIG. 15 is a plot illustrating a transmit spectrum of the communication system according to a specific embodiment of the present invention.

FIG. 15 illustrates a transmit spectrum of the communication system according to the present invention. The horizontal axis represents frequency in MHz, and the vertical axis represents a normalized transmit power in dB. The difference between the gain at the transmit frequency (i.e., 825 MHz) and the gain at the receive frequency (i.e., 870 MHz ) is approximately 120 dB.

As described in detail above, the bandpass amplifier according to the present invention includes a frequency selective network for noise shaping an input signal. The frequency selective network includes first filtering circuitry for selectively passing the transmit band, and second filtering circuitry for selectively passing the receive band. The first filtering circuitry may be a single transmit band resonator, or a plurality of transmit band resonators. Also, the second filtering circuitry may be a single receive band resonator, or a plurality of receive band resonators. According to the present invention, at least one transmit band resonator and at least one receive band resonator are configured to maximize a dynamic range associated with the amplifier.

It should be understood that the controller 1215 may take various forms. It may include one or more general purpose microprocessors that are selectively configured or reconfigured to implement the functions described herein. Or, it may include one or more specially designed processors or microcontrollers that contain logic and/or circuitry for implementing the functions described herein. Any of the logical devices serving as the controller 1215 may be designed as general purpose microprocessors, microcontrollers, application specific integrated circuits (ASICs), digital signal processors (DSPs), programmable logic devices (PLDs), field programmable gate arrays (FPGAs), and the like. They may execute instructions under the control of the hardware, firmware, software, reconfigurable hardware, combinations of these, etc. The hardware elements described above may be configured (usually temporarily) to act as one or more software modules for performing the operations of the present invention. All or any part of the bandpass amplifier and the communication system according to the present invention described above may be manufactured on a semiconductor chip, or may be manufactured as a hybrid integrated circuit.

While the present invention has been described in relation to a cell phone application, it should be readily apparent that the invention may be practiced in a wide variety of contexts and alternative embodiments. For example, the RF amplifier of the present invention could be used in a cell base station or any other application requiring an efficient RF amplifier. The bandpass amplifier of the present invention may be incorporated into a communication system. The digital amplifier of the present invention may also be used for RF transmissions at frequencies such as 1.8 GHz or 3.0 GHz or higher. In such embodiments, higher transmission rates can be achieved by increasing the sampling rate (fs) in accordance with the ratios described above. Transistors T1 and T2 can also be a number of different types of devices including MESFETs, BBTs, CMOS, or NMOS and can be fabricated from a number of different processes and materials, including GaAs. SiGe, or standard silicon. It will therefore be understood that the embodiments provided herein are merely exemplary, and that the true scope and spirit of the invention should be determined by the claims.

What is claimed is:

1. A bandpass amplifier for use in a communication system having a transmit band and a receive band associated therewith, comprising:

a frequency selective network for noise shaping an input signal, the frequency selective network comprising first filtering circuitry for selectively passing the transmit band, and second filtering circuitry for selectively passing the receive band, the first and second filtering circuitry being configured to effect suppression of energy associated with the transmit band in the receive band;

an analog-to-digital converter coupled to the frequency selective network;

a switching device coupled to the analog-to-digital converter for producing an output signal; and a feedback path for feeding back the output signal to the frequency selective network to facilitate the noise shaping, wherein the first filtering circuitry comprises at least one transmit band resonator operable to resonate at the transmit band, and the second filtering circuitry comprises at least one receive band resonator operable to resonate at the receive band, wherein at least one of the transmit band and receive band resonators comprises a transconductive element, an inductive element, and a capacitive element, and wherein the capacitive element comprises a bank of capacitors for tuning the corresponding resonator.

2. A bandpass amplifier for use in a communication system having a transmit band and a receive band associated therewith, comprising:

a frequency selective network for noise shaving an input signal, the frequency selective network comprising first filtering circuitry for selectively passing the transmit band, and second filtering circuitry for selectively passing the receive band, the first and second filtering circuitry being configured to effect suppression of energy associated with the transmit band in the receive band;

an analog-to-digital converter coupled to the frequency selective network;

a switching device coupled to the analog-to-digital converter for producing an output signal; and a feedback path for feeding back the output signal to the frequency selective network to facilitate the noise shaping, wherein the frequency selective network includes a first signal path including a first number of transmit band resonators operable to resonate at the transmit band, and a second number of receive band resonators operable to resonate at the receive band; and a second signal path including a third number of transmit band resonators operable to resonate at the transmit band, and a fourth number of receive band resonators operable to resonate at the receive band; wherein a difference between the first and third numbers is equal to or less than two; and a difference between the second and fourth numbers is equal to or less than two.

3. The bandpass amplifier of claim 2, wherein the first and second signal paths have at least one of the receive band resonators in common.

4. The bandpass amplifier of claim 3, wherein the first, second, third, and fourth numbers are one, three, one, and two, respectively.

5. The bandpass amplifier of claim 2, wherein the first signal path is a feedforward path, and the second signal path is a feedback path.

6. The bandpass amplifier of claim 5, wherein the feedforward path includes a transmit band resonator, and the feedback path includes two receive band resonators.

7. The bandpass amplifier of claim 2, wherein the first and second signal paths are differentially driven.

8. The bandpass amplifier of claim 2, wherein at least one of the first and second signal paths have at least one feedforward path coupled thereto.

9. The bandpass amplifier of claim 8, wherein the at least one feedforward path includes a coefficient element.

10. The bandpass amplifier of claim 2, wherein the feedback path includes a coefficient element.

11. The bandpass amplifier of claim 2, further comprising:

a signal generator for applying a signal to a selected one of the first number of transmit band resonators, the second number of receive band resonators, the third number of transmit band resonators, and the fourth number of receive band resonators;

a peak detector for detecting a signal strength of the signal passed through the selected one; and control circuitry for adjusting the selected resonator to maximize signal pass rate of the selected resonator at the corresponding one of the transmit and receive bands.

12. The bandpass amplifier of claim 11, wherein the control circuitry is further operable to receive information representing the transmit band, calculate the receive band based on the information, and adjust the first number of transmit band resonators, the second number of receive band resonators, the third number of transmit band resonators, and the fourth number of receive band resonators to maximize signal pass rate at the corresponding one of the transmit and receive bands.

13. A bandpass amplifier for use in a communication system having a transmit band and a receive band associated therewith, comprising:

a frequency selective network for noise shaping an input signal, the frequency selective network comprising first filtering circuitry for selectively passing the transmit band, and second filtering circuitry for selectively passing the receive band, the first and second filtering circuitry being configured to effect suppression of energy associated with the transmit band in the receive band;

an analog-to-digital converter coupled to the frequency selective network;

a switching device coupled to the analog-to-digital converter for producing an output signal;

a feedback path for feeding back the output signal to the frequency selective network to facilitate the noise shaping;

a signal generator for applying a signal to a selected one of the first filtering circuitry, and the second filtering circuitry;

a peak detector for detecting a strength of the signal passed through the selected filtering circuitry; and control circuitry for adjusting the selected filtering circuitry to maximize signal pass rate of the selected filtering circuitry at the corresponding one of the transmit and receive bands.

14. The bandpass amplifier of claim 13, wherein the control circuitry is further operable to receive information representing the transmit band;

calculate the receive band based on the information; and adjust the first filtering circuitry and the second filtering circuitry to maximize signal pass rate at the transmit band and the receive band, respectively.

15. A communication system having a bandpass amplifier having a transmit band and a receive band associated therewith, comprising:

a frequency selective network for noise shaving an input signal, the frequency selective network comprising first filtering circuitry for selectively passing the transmit band, and second filtering circuitry for selectively passing the receive band, the first and second filtering circuitry being configured to effect suppression of energy associated with the transmit band in the receive band;

an analog-to-digital converter coupled to the frequency selective network;

a switching device coupled to the analog-to-digital converter for producing an output signal; and a feedback path for feeding back the output signal to the frequency selective network to facilitate the noise shaping, wherein the first filtering circuitry comprises at least one transmit band resonator operable to resonate at the transmit band, and the second filtering circuitry comprises at least one receive band resonator operable to resonate at the receive band, wherein at least one of the transmit band and receive band resonators comprises a transconductive element, an inductive element, and a capacitive element, and wherein the capacitive element comprises a bank of capacitors for tuning the corresponding resonator.

16. A communication system having a bandpass amplifier having a transmit band and a receive band associated therewith, comprising:

a frequency selective network for noise shaping an input signal, the frequency selective network comprising first filtering circuitry for selectively passing the transmit band, and second filtering circuitry for selectively passing the receive band, the first and second filtering circuitry being configured to effect suppression of energy associated with the transmit band in the receive band;

an analog-to-digital converter coupled to the frequency selective network;

a switching device coupled to the analog-to-digital converter for producing an output signal; and a feedback path for feeding back the output signal to the frequency selective network to facilitate the noise shaping, wherein the frequency selective network includes a first signal path including a first number of transmit band resonators operable to resonate at the transmit band, and a second number of receive band resonators operable to resonate at the receive band; and a second signal path including a third number of transmit band resonators operable to resonate at the transmit band, and a fourth number of receive band resonators operable to resonate at the receive band; wherein a difference between the first and third numbers is equal to or less than two; and a difference between the second and fourth numbers is equal to or less than two.

17. A communication system having a bandpass amplifier having a transmit band and a receive band associated therewith, comprising:

a frequency selective network for noise shaping an input signal, the frequency selective network comprising first filtering circuitry for selectively passing the transmit band, and second filtering circuitry for selectively passing the receive band, the first and second filtering circuitry being configured to effect suppression of energy associated with the transmit band in the receive band;

an analog-to-digital converter coupled to the frequency selective network;

a switching device coupled to the analog-to-digital converter for producing an output signal;

a feedback path for feeding back the output signal to the frequency selective network to facilitate the noise shaping;

a signal generator for applying a signal to a selected one of the first filtering circuitry, and the second filtering circuitry;

a peak detector for detecting a strength of the signal passed through the selected filtering circuitry; and control circuitry for adjusting the selected filtering circuitry to maximize signal pass rate of the selected filtering circuitry at the corresponding one of the transmit and receive bands.

18. The communication system of claim 17, wherein the control circuitry is further operable to receive information representing the transmit band;

calculate the receive band based on the information; and adjust the first filtering circuitry and the second filtering circuitry to maximize signal pass rate at the transmit band and the receive band, respectively.

19. The communication system of 18, wherein the control circuitry is further operable to receive information representing the transmit band from a base station.

20. The communication system of claim 19, wherein the receiving, the calculating, and the calibrating are performed before a user of the communication system initiates a communication with the base station.

21. The communication system of claim 18, wherein the control circuitry is further operable to select a filter which is to be calibrated among the first and second filtering circuitry;

apply a signal to the selected filter;

detect a strength of the signal which passes through the selected filter; and adjust the selected filter in response to the strength.

22. The communication system of claim 21, wherein the control circuitry is further operable to modify capacitance associated with the selected filter.

23. The communication system of claim 22, wherein the control circuitry is further operable to selectively couple at least one of a plurality of capacitors provided in the selected filter; and wherein a variation in the signal strength is determined by comparing a plurality of signal strengths corresponding to different values of the capacitance.

24. The communication system of claim 21, wherein the control circuitry is further operable to cut off electric power supplied to the plurality of the filters except the selected filter.

25. A method of calibrating a bandpass amplifier having a transmit band and a receive band associated therewith, the bandpass amplifier including first filtering circuitry for selectively passing the transmit band and second filtering circuitry for selectively passing the receive band, comprising:

receiving information representing the transmit band;

calculating the receive band based on the information and a frequency offset between the transmit band and the receive band; and adjusting the first filtering circuitry and the second filtering circuitry to maximize signal pass rate at the transmit band and the receive band, respectively, wherein the adjusting includes selecting a filter which is to be calibrated among the first and second filtering circuitry;

applying a signal to the selected filter;

detecting signal strength of the signal which passes through the selected filter; and tuning the selected filter in response to the signal strength.

26. The method of claim 25, wherein the tuning comprises modifying associated with the selected filter.

27. The method of claim 26, wherein the modifying includes selectively coupling at least one of a plurality of capacitors provided in the selected filter; and wherein a variation in the signal strength is determined by comparing a plurality of signal strengths corresponding to different values of the capacitance.

28. The method of claim 25, wherein the selecting includes cutting off electric power supplied to the plurality of the filters except the selected filter.

* * * * *

UNITED STATES PATENT AND TRADEMARK OFFICE
CERTIFICATE OF CORRECTION

PATENT NO. : 6,798,288 B1
DATED : September 28, 2004
INVENTOR(S) : Jayaraman et al.

It is certified that error appears in the above-identified patent and that said Letters Patent is hereby corrected as shown below:

Column 4,
Line 24, change "an LS antenna" to -- an antenna --.

Column 5,
Line 36, change "and 77 turns" to -- and T2 turns --.
Line 58, change "pattern ie is generated" to -- pattern generated --.
Line 59, change "T1 and T7" to -- T1 and T2 --.

Column 6,
Line 10, change "the act that" to -- the fact that --.

Column 15,
Line 43, change "noise shaving" to -- noise shaping --.

Column 17,
Line 18, change "noise shaving" to -- noise shaping --.

Column 20,
Line 9, change "modifying associated" to -- modifying capacitance associated --.

Signed and Sealed this

Twenty-fifth Day of January, 2005

JON W. DUDAS
*Director of the United States Patent and Trademark Office*